(12) United States Patent
Zhang et al.

(10) Patent No.: US 11,714,328 B2
(45) Date of Patent: Aug. 1, 2023

(54) TERMINAL HAVING COLOR-CHANGING LAYER

(71) Applicant: BEIJING XIAOMI MOBILE SOFTWARE CO., LTD., Beijing (CN)

(72) Inventors: Lintao Zhang, Beijing (CN); Wei Chen, Beijing (CN); Jiwei Chen, Beijing (CN); Jing Gao, Beijing (CN); Zhiwen Xu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 583 days.

(21) Appl. No.: 16/692,553

(22) Filed: Nov. 22, 2019

(65) Prior Publication Data

US 2020/0310210 A1    Oct. 1, 2020

(30) Foreign Application Priority Data

Mar. 28, 2019  (CN) .......................... 201910243891.6

(51) Int. Cl.
*G02F 1/157*  (2006.01)
*G02F 1/01*   (2006.01)
(Continued)

(52) U.S. Cl.
CPC ............ *G02F 1/157* (2013.01); *G02F 1/0147* (2013.01); *G02F 1/092* (2013.01); *G02F 1/13338* (2013.01); *G02F 1/133528* (2013.01); *G02F 1/163* (2013.01); *G06F 1/1643* (2013.01); *G06F 1/1684* (2013.01); *H04M 1/0266* (2013.01);
(Continued)

(58) Field of Classification Search
CPC ......................... G02F 2201/44; H01L 27/3232
See application file for complete search history.

(56) References Cited

U.S. PATENT DOCUMENTS

2017/0212398 A1    7/2017  Cao et al.
2019/0208044 A1*   7/2019  Lee ..................... H01L 27/3227
(Continued)

FOREIGN PATENT DOCUMENTS

CN    106292017 A    1/2017
CN    106936958 A    7/2017
(Continued)

OTHER PUBLICATIONS

First office action of Chinese application No. 201910243891.6 issued on Aug. 4, 2021.
(Continued)

*Primary Examiner* — Paisley L Wilson
(74) *Attorney, Agent, or Firm* — Arch & Lake LLP (57) ABSTRACT

Disclosed is a terminal, including: a display screen including a sensor area, the sensor area being a transparent display area on the display screen; a sensor disposed below the display screen, the sensor having a photosensitive portion; and a color-changing layer above the display screen, where the photosensitive portion of the sensor is within a first orthographic projection range of the sensor area, and the sensor area is within a second orthographic projection range of the color-changing layer; the transparent display area is transparent when the sensor is in operation; and the color-changing layer is configured to switch between a colorless state and a colored state.

12 Claims, 5 Drawing Sheets

(51) Int. Cl.
  *G02F 1/09* (2006.01)
  *G02F 1/1335* (2006.01)
  *G02F 1/163* (2006.01)
  *G02F 1/1333* (2006.01)
  *G06F 1/16* (2006.01)
  *H04M 1/02* (2006.01)
  *H10K 59/50* (2023.01)
  *G06F 3/041* (2006.01)
  *G06V 40/13* (2022.01)
  *H04N 23/57* (2023.01)

(52) U.S. Cl.
  CPC ......... *H10K 59/50* (2023.02); *G02F 2201/44* (2013.01); *G06F 3/041* (2013.01); *G06V 40/1318* (2022.01); *H04M 1/0264* (2013.01); *H04N 23/57* (2023.01)

(56) References Cited

U.S. PATENT DOCUMENTS

2020/0073190 A1* 3/2020 Zhang .................. G02F 1/153
2020/0213492 A1* 7/2020 Yang .................. H04N 5/2257

FOREIGN PATENT DOCUMENTS

| | | |
|---|---|---|
| CN | 107168465 A | 9/2017 |
| CN | 107943211 A | 4/2018 |
| CN | 108885376 A | 11/2018 |
| CN | 108987451 A | 12/2018 |
| CN | 109034103 A | 12/2018 |
| CN | 109116656 A | 1/2019 |
| CN | 109459902 A | 3/2019 |
| CN | 109462675 A | 3/2019 |
| CN | 109495622 A | 3/2019 |
| CN | 208819534 U | 5/2019 |
| WO | 2016192378 A1 | 12/2016 |

OTHER PUBLICATIONS

Communication pursuant to Article 94(3) EPC of counterpart EP application No. 19212717.3 dated Aug. 4, 2021.
Extended European Search Report of European Application No. 19212717.3 dated Jan. 31, 2020, (8p).
China National Intellectual Property Administration, Notification to grant patent right for invention of Chinese applicatior No. 201910243891.6 dated Jan. 28, 2023, which is foreign counterpart application of this US application,with English translation, (6p).

* cited by examiner

TERMINAL HAVING COLOR-CHANGING LAYER

CROSS-REFERENCE TO RELATED APPLICATION

This Application claims the benefit of and priority to Chinese Application No. 201910243891.6, filed on Mar. 28, 2019, the contents of all of which are incorporated by reference herein.

TECHNICAL FIELD

The present disclosure relates to the technical field of display and particularly relates to a terminal.

BACKGROUND

An electronic terminal includes sensors, such as a camera and an optical fingerprint sensor, which are usually on the front panel or the back cover of the electronic terminal.

SUMMARY

Various examples of the present disclosure provide a terminal.

According to a first aspect of the present disclosure, there is provided a terminal. The terminal includes a display screen including a sensor area, the sensor area being a transparent display area on the display screen; a sensor disposed below the display screen, the sensor having a photosensitive portion; and a color-changing layer above the display screen. The photosensitive portion of the sensor is within a first orthographic projection range of the sensor area, and the sensor area is within a second orthographic projection range of the color-changing layer. The transparent display area is transparent when the sensor is in operation. The color-changing layer is configured to switch between a colorless state and a colored state.

According to a second aspect of the present disclosure, there is provided a terminal, including: a display component, the display component including a display screen and a color-changing layer disposed above the display screen. The color-changing layer is configured to switch between a colorless state and a colored state.

According to a third aspect of the present disclosure, there is provided a terminal, including a back cover and a color-changing layer above the back cover, where the color-changing layer is configured to switch between a colorless state and a colored state.

BRIEF DESCRIPTION OF THE DRAWINGS

The accompanying drawings, which are incorporated in and constitute a part of this specification, illustrate examples consistent with the present disclosure and, together with the description, serve to explain the principles of the present disclosure. Apparently, the accompanying drawings in the following description show merely some examples of the present disclosure, and a person of ordinary skill in the art may also derive other drawings from these accompanying drawings without creative efforts.

DETAILED DESCRIPTION

Reference is made in detail to exemplary aspects, examples of which are illustrated in the accompanying drawings. The following description refers to the accompanying drawings in which the same numbers in different drawings represent the same or similar elements unless otherwise represented. The implementations set forth in the following description of exemplary aspects do not represent all implementations consistent with the present disclosure. Instead, they are merely examples of devices and methods consistent with aspects related to the disclosure.

The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

The words "above", "below", "under", "upper", "lower", "left", "right", etc., may be used to refer to relative positions of an element under normal operation mode or installation orientation, to facilitate understanding of the relevant embodiments. The scope of the disclosure is not limited to the specific operation mode or installation orientation as described.

It should also be noted that in some alternative implementations, the functions/acts noted may occur out of the order noted in the figures. For example, two functions or acts shown in succession may in fact be executed concurrently or may sometimes be executed in the reverse order, depending upon the functionality/acts involved.

When a sensor, such as a camera and an optical fingerprint sensor, is disposed on the front panel, a design method of under-screen sensor for the purpose of increasing the screen ratio of the electronic terminal may be adopted. In the design of the under-screen sensor, the sensor is provided below the display screen, and the sensor area corresponding to the sensor on the display screen forms a through hole or a transparent structure, thereby ensuring that the sensor is not shielded by the display screen and thus can operate normally.

In the above design mode, the color of the sensor area is different from the surrounding color in either the screen-on state or the screen-off state, forming a strong contrast, which seriously affects the aesthetics of the terminal.

Various examples of the present disclosure provide a terminal, which at least partially alleviates the problem that the color of the sensor area is different from the surrounding color in the screen-on state or the screen-off state, forming a strong contrast and seriously affecting the aesthetics of the terminal.

Figure 1:
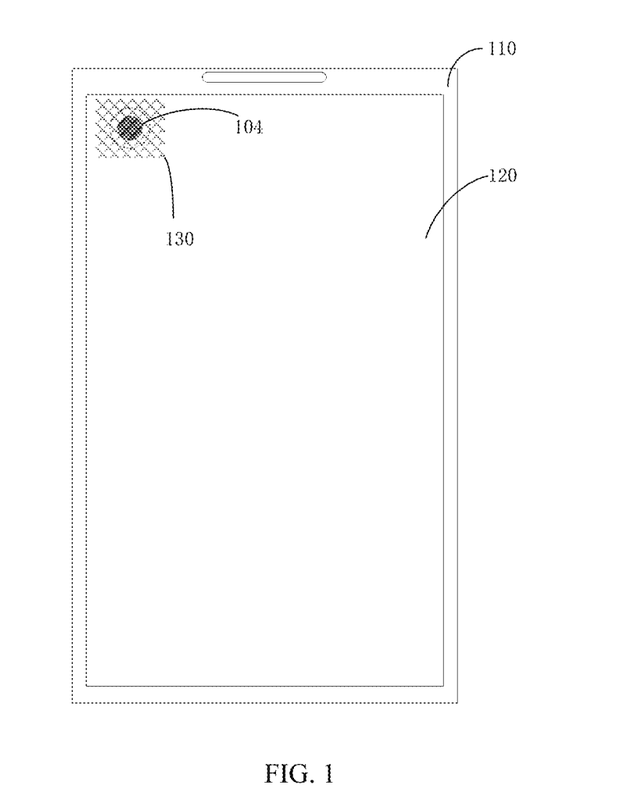
FIG. 1 is a front schematic view of a terminal according to an example of the present disclosure.

FIG. 1 shows a front schematic view of a terminal according to an example of the present disclosure. The terminal includes a display screen 120 and a sensor 104 disposed below the display screen 120.

The display screen 120 is provided with a sensor area. The sensor 104 has a photosensitive portion which is disposed in a first orthographic projection range of the sensor area. The sensor area is a transparent display area formed on the display screen. The transparent display area is transparent when the sensor is in operation. The first orthographic projection range is a projection range corresponding to the sensor area of the display screen 120. The orthographic projection refers to a projection perpendicular to the front side of the display screen 120 toward the lower side of the display screen 120.

A color-changing layer 130 is disposed above the display screen 120 for switching between a colorless state and a colored state. The sensor area is located within a second orthographic projection range of the color-changing layer 130. The second orthographic projection range is a projection range corresponding to the color-changing layer 130. That is, the color-changing layer 130 covers the sensor area of the display screen 120.

Optionally, the sensor 104 is a photosensitive sensor, which is a sensor 104 that operates with light. The photosensitive sensor includes at least one of a camera 104, an ambient light sensor 104, a distance sensor 104, or a light fingerprint sensor 104.

Optionally, the terminal further includes a middle frame 110. The display screen 120 is disposed on the front side of the middle frame 110. The display screen 120 occupies the entire area or almost the entire area of the front side (e.g., 95% or more, 97% or more, 98% or more).

In the example, by providing a color-changing layer at a position corresponding to the sensor area, when the sensor needs to be used, the color-changing layer is controlled to be in a colorless state, thereby not affecting the normal use of the sensor; and when the sensor is not used, the color-changing layer is in a colored state, so that the color-changing layer and the surrounding color are identical or the same, which can effectively reduce the color difference between the sensor area and the surrounding area, and improve the aesthetic appearance of the terminal.

Figure 2:
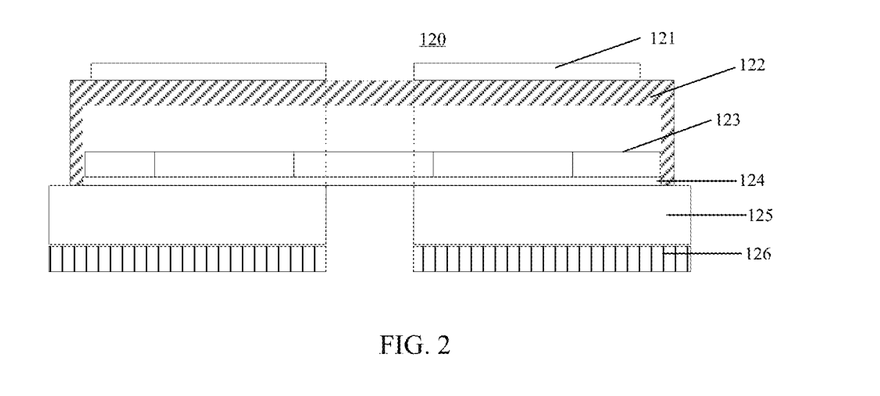
FIG. 2 is a side cross-sectional view of a display screen of a terminal according to an example of the present disclosure.

In an optional example based on FIG. 1, FIG. 2 shows a side cross-sectional view of a display screen of a terminal. The display screen 120 is an OLED screen. The display screen 120 includes a polarizer layer 121, an encapsulation layer 122, an OLED layer 123, a drive circuit layer 124, a glass substrate layer 125, and a light shielding layer 126 arranged in sequence. The polarizer layer 121, the glass substrate layer 125, and the light shielding layer 126 are formed with a corresponding or an aligned opening area. An area of the encapsulation layer 122, the OLED layer 123 and the drive circuit layer 124 corresponding to the opening area forms the sensor area.

The sensor area is a complete structure without puncturing or an opening. In an optional example, in order to ensure that the sensor area of the display screen can display the content normally, and to ensure that the operation of the sensor below the display screen is not affected, the drive circuit layer 124 is made of a transparent conductive material. For example, a transparent conductive film (TCF) can be used. The transparent conductive film drives an OLED screen at a corresponding position in the sensor area, thereby ensuring a normal display function.

Optionally, an electronic device in the opening area of the drive circuit layer 124 in certain technology may be moved into a non-opening area in advance, in order to avoid the influence of the opening area on the electronic device, or the transparency influence of the opaque electronic device to the sensor area.

In the example, by providing a color-changing layer at a position corresponding to the sensor area, when the sensor needs to be used, the color-changing layer is controlled to be in a colorless state, thereby not affecting the normal use of the sensor; and when the sensor is not used, the color-changing layer is in a colored state, so that the color-changing layer and the surrounding color are identical or the same, which can effectively reduce the color difference between the sensor area and the surrounding area, and improve the aesthetic appearance of the terminal. Since the sensor area has a display capability, the display screen can have an integral "mirror" effect whether in a display state or a non-display state, which enhances the aesthetic appearance of the terminal and the user experience.

In an optional example based on FIG. 1, the display screen 120 is an LCD screen. The display screen 120 includes a polarizer layer, a liquid crystal layer, and a backlight layer arranged in sequence. A corresponding or an aligned opening area is formed on the polarizer layer and the backlight layer. An area on the liquid crystal layer corresponding to the opening area forms the sensor area.

The liquid crystal screen is a complete structure without punching or an opening. A through hole is disposed on a backlight layer below the liquid crystal layer. In an optional example, in order to ensure that the sensor area of the display screen can display the content normally, the backlight on through hole area or all the backlight adopts a mini-LED that provides backlighting for the opening area and the display screen.

In summary, the terminal provided in the example can ensure the integrity of the liquid crystal layer by not providing a through hole on the liquid crystal layer, so that the edge sealing process is not required, avoiding the black edge structure which would be formed by the sealing process if the liquid crystal layer is etched to form an opening. At the same time, a mini-LED is arranged in the through-hole area or all the backlight to provide necessary backlighting for the sensor area of the display screen, thereby ensuring that the sensor area of the display screen 120 can display the content normally.

In an optional example based on FIG. 1, the color-changing layer 130 can switch between a colorless state and a colored state. For example, the color-changing layer 130 is controlled to switch from the colored state to the colorless state when the sensor 104 is in an operating state; and switch from the colorless state to the colored state when the sensor 104 is in a non-operating state. For example, when the display screen 120 is displaying content, the color-changing layer 130 switches to a colorless state, and when the display screen 120 does not display content, the color-changing layer 130 is in a colored state.

Optionally, the color-changing layer 130 further includes at least one intermediate state. The color-changing layer 130 is configured to switch among the colorless state, the at least one intermediate state, and the colored state.

The colored state may refer to a state in which the color is dark in the senses. For example, the color-changing layer being in a completely opaque state is black. Or, the colored state may be a state in which the light transmittance is less than a first threshold. For example, the light transmittance of the color-changing layer is 0%, 10% or 20%.

The colorless state may refer to a state in which there is no color or the color is light in the senses. Or, the colorless state may be a state in which the light transmittance is greater than a second threshold. The colorless state is that the light transmittance is 80%, 90% or 100%. For ease of understanding and description, the colorless state may also be referred to as a light transmissive state, a transparent state, or the like.

The intermediate state may refer to a state in which the color is between the colorless state and the colored state in the senses. Or, the intermediate state may be a state in which the light transmittance is greater than the first threshold and less than the second threshold. For example, the light transmittance of the color-changing layer in the intermediate state is between 40% and 60%.

The color-changing layer may also be other colors when being completely opaque (i.e., in the colored state), for example, red, gold, green, etc., and is uniform with or the same as the color of the terminal.

In an optional example based on FIG. 1, the color-changing layer 130 may be implemented using any one of an electrochromic layer, a thermochromic layer, and a magnetochromic layer. The implementation of the electrochromic layer and the thermochromic layer for the color-changing layer 130 will be described below using the example of FIG. 3. The implementation of the magnetochromic layer for the color-changing layer 130 will be described using the example of FIG. 4.

Figure 3:
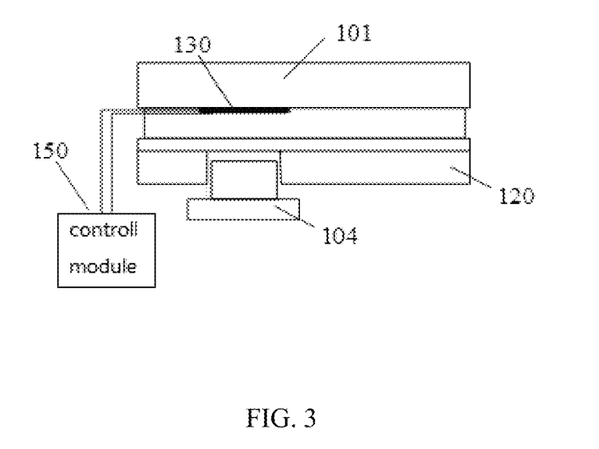
FIG. 3 is a side cross-sectional view of a terminal according to an example of the present disclosure.

FIG. 3 shows a side cross-sectional view of a terminal according to an example of the present disclosure. The terminal includes a display screen 120, a sensor 104 disposed below the display screen 120, and a color-changing layer 130 disposed above the sensor 104. The color-changing layer 130 is electrically connected to a control module 150 or a controller 150.

Optionally, the control module 150 may be an integrated circuit (IC) touch chip which is electrically connected to a processor in the terminal. Or, the color-changing layer 130 may be directly electrically connected to the processor in the terminal. Electrical connection includes any one of a wire connection, a flexible circuit board connection, and a printed circuit board connection.

Optionally, the color-changing layer 130 is further connected to a power source. When the color-changing layer is an electrochromic layer, the color-changing layer comprises electrodes and an electrochromic material disposed between the electrodes. The color change material is in a colorless state when the electrodes are not energized. When the terminal needs to make the color-changing layer 130 be in a colorless state, the control module controls the power source not to energize the electrodes. When the terminal needs to hide the sensor, the control module controls the power source to energize the electrodes, so that the electrochromic material is in a colorless state under the action of the electrodes, which has the effect of hiding the sensor. For example, a control signal of the electrochromic layer can be either a direct current signal or an alternating current signal.

When the color-changing layer is a thermochromic layer, the color-changing layer includes a heating layer connected to the power source. The heating layer is provided with a thermochromic material. The thermochromic material is in a colorless state at a high temperature and returns to a colored state at a normal temperature. When the terminal needs to make the color-changing layer 130 be in a colorless state, the control module controls the power source to energize the heating layer. The temperature of the heating layer is raised to make the color-changing layer be in a colorless state. When the terminal needs to hide the sensor, the control module controls the power source not to energize the electrodes, and the thermochromic material is in a colorless state. In one example, the thermochromic material is in a colorless state at a normal temperature, and returns to a colored state at a high temperature.

The control module 150 in the terminal controls the magnitude of the current flowing through the color-changing layer 130, or the amount of heat generated by the current, to control the states (e.g., the colorless state or the colored state) of the color-changing layer 130.

For example, the sensor 104 being a camera is taken as an example. When the camera 104 is in an operating state, the control module 150 sends a first electrical signal to the color-changing layer 130 to switch the color-changing layer 130 from the colored state to the colorless state. The camera 104 performs a photographing operation through a front cover 101. After the camera 104 completes the photographing operation and enters a non-operating state, the control module 150 sends a second electrical signal to the color-changing layer 130 to switch the color-changing layer 130 from the colorless state to the colored state.

Optionally, the color-changing layer 130 is an electrothermal mixed color-changing layer, that is, the color-changing layer 130 includes both an electrochromic layer and a thermochromic layer.

In the example, the color-changing layer is connected to the control module. The control module switches the color-changing layer between the colored state and the colorless state by the magnitude of the current flowing into the color-changing layer or the amount of heat generated by the current. The color-changing layer is in a colorless state when the display screen displays content, which does not affect the display effect of the screen, and in a colored state when the display does not display content, hiding the camera and the terminal structure below the screen.

Figure 4:
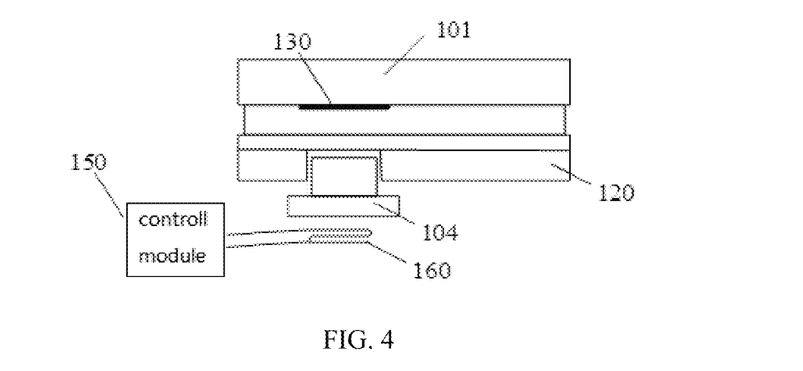
FIG. 4 is a side cross-sectional view of a terminal according to an example of the present disclosure.

FIG. 4 shows a side cross-sectional view of a terminal according to an example of the present disclosure. The color-changing layer 130 is a magnetochromic layer. A coil structure 160 corresponding to the magnetochromic layer is disposed below the display screen. The coil structure 160 is electrically connected to the control module or the controller 150. The magnetochromic layer can switch between a colored state and a colorless state under the action of a magnetic field.

Optionally, the control module 150 may be an integrated circuit (IC) touch chip which is electrically connected to a processor in the terminal. Or, the color-changing layer 130 may be directly electrically connected to the processor in the terminal. Electrical connection includes any one of a wire connection, a flexible circuit board connection, and a printed circuit board connection. For example, when an electrical connection line is not provided on a layer of the screen where the color-changing layer is located, the color-changing layer 130 is separately provided with an electrical connection line to be connected to the processor in the terminal, or the color-changing layer 130 is connected to an IC touch chip which is connected to the processor in the terminal. When an electrical connection line is provided in advance on the layer of the screen where the color-changing layer is located, the color-changing layer 130 together with the electrical connection line is connected to the IC touch chip, and then connected to the processor in the terminal.

The control module 150 is configured to control the coil structure 160 to generate a magnetic field, and control the direction of the magnetic field passing through the magnetochromic layer by changing the direction of the current. When the magnetic field passing through the magnetochromic layer is in a first direction, the magnetochromic layer is in a colored state, and when the magnetic field passing through the magnetochromic layer is in a second direction, the magnetochromic layer is in a colorless state. The magnitude of the current passing through the coil structure changes the intensity of the magnetic field, thereby changing the degree of light transmission (light transmittance) of the magnetochromic layer.

The above example changes the direction of the magnetic field generated by the coil structure by changing the direction of the current in the coil structure, and changes the intensity of the magnetic field generated by changing the magnitude of the current in the coil structure, thereby changing the degree of light transmission of the magnetochromic layer. Since the magnetic field changes under the control of the current without delay, the control of the electrical signal can be responded rapidly, and thus the terminal in the example has good controllability.

Figure 5:
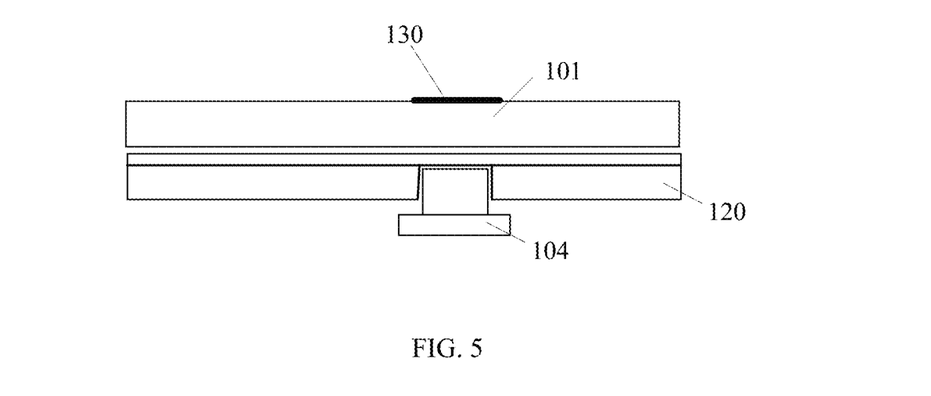
FIG. 5 is a schematic diagram of a color-changing layer of a terminal being located on an upper surface of a front cover according to an example of the present disclosure.

In an optional example based on any of the examples of FIGS. 1, 3 and 4, the front cover 101 is disposed above the display screen 120, and the color-changing layer 130 is disposed on the front cover 101. FIG. 5 is a schematic diagram of a color-changing layer of a terminal being located on an upper surface of a front cover according to an example of the present disclosure.

The front cover 101 is disposed on the top of the display screen of the terminal in an adhesive manner to protect and decorate the display screen. Generally, the front cover 101 is made of glass, also called LENS, and has high hardness and high transmittance. Of course, some devices are made of sapphire, but the purpose and function are basically the same, i.e., to protect and decorate the display screen.

In one implementation, the color-changing layer 130 includes a color change material that is disposed on the upper surface of the front cover 101 by sputtering, spraying, or coating.

In another implementation, the color-changing layer 130 includes a color change material and an electrode. The electrode is disposed in advance on the upper surface of the front cover 101 during the preparation of the front cover 101, and is electrically connected to the control module in the terminal through a conductive line. The control module controls the on/off state of the electrode. The color change material is disposed on the upper surface of the front cover 101 by sputtering, spraying or coating. The color change material changes its own degree of light transmission according to the on/off state of the electrode. For example, when the electrode is in an on state, the color change material has a high degree of light transmission, and the front cover 101 is in a colorless state. When the electrode is in an off state, the color change material has a low degree of light transmission, and the front cover 101 is a colored state. Alternatively, when the electrode is in an on state, the color change material has a low degree of light transmission, and the front cover 101 is in a colored state; and when the electrode is in an off state, the color change material has a high degree of light transmission, and the front cover 101 is in a colorless state.

In another implementation, the color-changing layer 130 includes a color change material and an electric heating wire. The electric heating wire is disposed in advance on the upper surface of the front cover 101 during the preparation of the front cover 101, and is electrically connected to the control module in the terminal through a conductive line. The control module controls the on/off state of the electric heating wire. The color change material is disposed on the upper surface of the front cover 101 by sputtering, spraying or coating. The color change material changes its own degree of light transmission according to the temperature of the electric heating wire. For example, when the temperature of the electric heating wire is high, the color change material has a high degree of light transmission, and the front cover 101 is in a colorless state. When the temperature of the electric heating wire is low, the color change material has a low degree of light transmission, and the front cover 101 is in a colored state. Alternatively, when the temperature of the electric heating wire is low, the color change material has a low degree of light transmission, and the front cover 101 is in a colored state; and when the temperature of the electric heating wire is high, the color change material has a high degree of light transmission, and the front cover 101 is in a colorless state.

Since the color change material of the color-changing layer 130 is disposed on the upper surface of the front cover, it is easy to handle during sputtering, spraying, or coating, easy to produce and process, and easy to recoat at a later stage.

Figure 6:
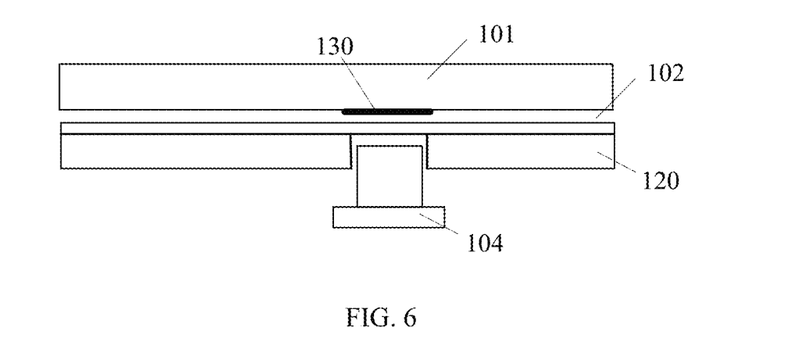
FIG. 6 is a schematic diagram of a terminal according to an example of the present disclosure.

FIG. 6 shows a schematic diagram of a terminal according to an embodiment of the present disclosure. The color-changing layer 130 is disposed on a lower surface of the front cover 101.

Similar to the example of FIG. 5, the color-changing layer 130 includes a color change material, but the color change material is disposed on the lower surface of the front cover 101 by sputtering, spraying, or coating.

In another implementation, the color-changing layer 130 includes a color change material and an electrode. The electrode is disposed in advance on the lower surface of the front cover 101 during the preparation of the front cover 101, and is electrically connected to the control module in the terminal through a conductive line. The control module controls the on/off state of the electrode. The color change material is disposed on the lower surface of the front cover 101 by sputtering, spraying or coating. The color change material changes its own degree of light transmission according to the on/off state of the electrode. For example, when the electrode is in an on state, the color change material has a high degree of light transmission, and the front cover 101 is in a colorless state. When the electrode is in an off state, the color change material has a low degree of light transmission, and the front cover 101 is a colored state. Alternatively, when the electrode is in an on state, the color change material has a low degree of light transmission, and the front cover 101 is in a colored state; and when the electrode is in an off state, the color change material has a high degree of light transmission, and the front cover 101 is in a colorless state.

In another implementation, the color-changing layer 130 includes a color change material and an electric heating wire. The electric heating wire is disposed in advance on the lower surface of the front cover 101 during the preparation of the front cover 101, and is electrically connected to the control module in the terminal through a conductive line. The control module controls the on/off state of the electric heating wire. The color change material is disposed on the lower surface of the front cover 101 by sputtering, spraying or coating. The color change material changes its own degree of light transmission according to the temperature of the electric heating wire. For example, when the temperature of the electric heating wire is high, the color change material has a high degree of light transmission, and the front cover 101 is in a colorless state. When the temperature of the electric heating wire is low, the color change material has a low degree of light transmission, and the front cover 101 is in a colored state. Alternatively, when the temperature of the electric heating wire is low, the color change material has a low degree of light transmission, and the front cover 101 is in a colored state; and when the temperature of the electric heating wire is high, the color change material has a high degree of light transmission, and the front cover 101 is in a colorless state.

Since the color change material of the color-changing layer 130 is disposed on the lower surface of the front cover, there is no problem of wear and tear during use, and the connection line which connects the color-changing layer and the control module can be directly disposed on the lower surface of the front cover 101. Thus, the terminal has a low failure rate and high reliability.

Figure 7:
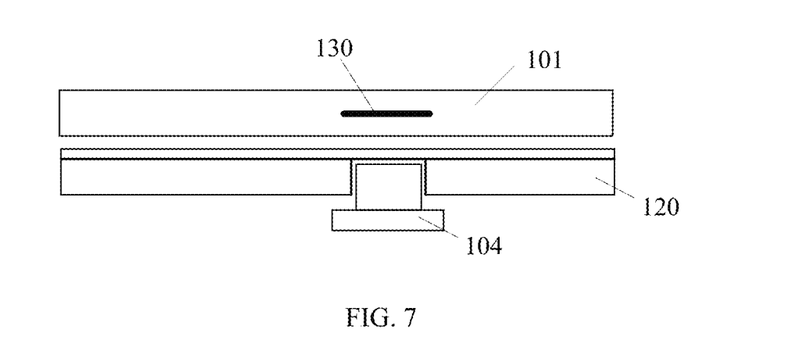
FIG. 7 is a schematic diagram of a terminal according to an example of the present disclosure.

FIG. 7 shows a schematic diagram of a terminal according to an example of the present disclosure. The color-changing layer 130 is disposed inside the front cover 101. A material having a color change ability is disposed in the front cover 101 during the process of manufacturing the front cover 101.

In one implementation, the color-changing layer 130 includes a color change material and an electrode. The electrode is disposed in advance inside the front cover 101 during the preparation of the front cover 101, and is electrically connected to the control module in the terminal through a conductive line. The control module controls the on/off state of the electrode. The color change material is disposed inside the front cover 101 by sputtering, spraying or coating. The color change material changes its own degree of light transmission according to the on/off state of the electrode. For example, when the electrode is in an on state, the color change material has a high degree of light transmission, and the front cover 101 is in a colorless state. When the electrode is in an off state, the color change material has a low degree of light transmission, and the front cover 101 is a colored state. Alternatively, when the electrode is in an on state, the color change material has a low degree of light transmission, and the front cover 101 is in a colored state; and when the electrode is in an off state, the color change material has a high degree of light transmission, and the front cover 101 is in a colorless state.

In another implementation, the color-changing layer 130 includes a color change material and an electric heating wire. The electric heating wire is disposed in advance inside the front cover 101 during the preparation of the front cover 101, and is electrically connected to the control module in the terminal through a conductive line. The control module controls the on/off state of the electric heating wire. The color change material is disposed inside the front cover 101 by sputtering, spraying or coating. The color change material changes its own degree of light transmission according to the temperature of the electric heating wire. For example, when the temperature of the electric heating wire is high, the color change material has a high degree of light transmission, and the front cover 101 is in a colorless state. When the temperature of the electric heating wire is low, the color change material has a low degree of light transmission, and the front cover 101 is in a colored state. Alternatively, when the temperature of the electric heating wire is low, the color change material has a low degree of light transmission, and the front cover 101 is in a colored state; and when the temperature of the electric heating wire is high, the color change material has a high degree of light transmission, and the front cover 101 is in a colorless state.

Since the color-changing layer 130 is disposed inside the front cover 101, there is no problem of being rubbed off due to long-term use.

Optionally, since the front cover 101 is not provided with an electrical connection line, the color-changing layer 130 is separately provided with a connection line to be connected to the control module in the terminal, or the color-changing layer 130 is connected to an IC touch chip. The IC touch chip changes the state of the color-changing layer 130 under the control of the control module.

In an optional example based on FIG. 3 and FIG. 4, the front cover 101 is disposed above the display screen 120, and a touch layer 102 is further disposed between the front cover 101 and the display screen 120. The touch layer 102 is configured to identify the location of the touch and the slide direction. The processor in the terminal determines the display content of the display screen accordingly.

Figure 8:
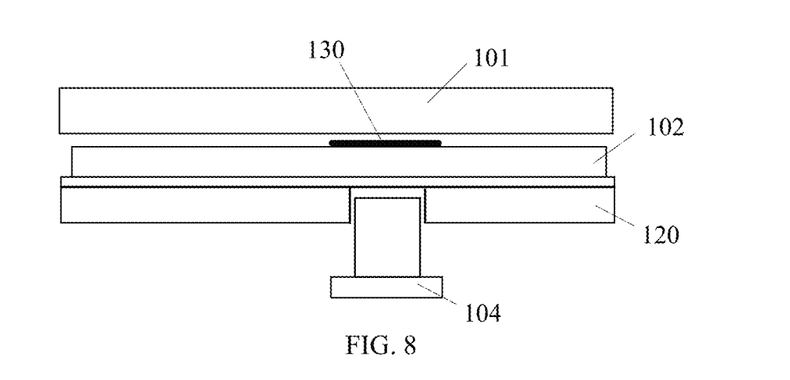
FIG. 8 is a schematic diagram of a color-changing layer of a terminal being located on an upper surface of a touch layer according to an example of the present disclosure.

FIG. 8 is a schematic diagram of a color-changing layer of a terminal being located on an upper surface of a touch layer according to an example of the present disclosure. The color-changing layer 130 includes a color change material which is disposed on an upper surface of the touch layer 102 by sputtering, spraying, or coating.

In another implementation, the color-changing layer 130 includes a color change material and an electrode. The electrode is disposed in advance on the upper surface of the touch layer 102 during the preparation of the touch layer 102, and is electrically connected to the control module in the terminal through a conductive line. The control module controls the on/off state of the electrode. The color change material is disposed on the upper surface of the touch layer 102 by sputtering, spraying or coating. The color change material changes its own degree of light transmission according to the on/off state of the electrode. For example, when the electrode is in an on state, the color change material has a high degree of light transmission, and the touch layer 102 is in a colorless state. When the electrode is in an off state, the color change material has a low degree of light transmission, and the touch layer 102 is a colored state. Alternatively, when the electrode is in an on state, the color change material has a low degree of light transmission, and the touch layer 102 is in a colored state; and when the electrode is in an off state, the color change material has a high degree of light transmission, and the touch layer 102 is in a colorless state.

In another implementation, the color-changing layer 130 includes a color change material and an electric heating wire. The electric heating wire is disposed in advance on the upper surface of the touch layer 102 during the preparation of the touch layer 102, and is electrically connected to the control module in the terminal through a conductive line. The control module controls the on/off state of the electric heating wire. The color change material is disposed on the upper surface of the touch layer 102 by sputtering, spraying or coating. The color change material changes its own degree of light transmission according to the temperature of the electric heating wire. For example, when the temperature of the electric heating wire is high, the color change material has a high degree of light transmission, and the touch layer 102 is in a colorless state. When the temperature of the electric heating wire is low, the color change material has a low degree of light transmission, and the touch layer 102 is in a colored state. Alternatively, when the temperature of the electric heating wire is low, the color change material has a low degree of light transmission, and the touch layer 102 is in a colored state; and when the temperature of the electric heating wire is high, the color change material has a high degree of light transmission, and the touch layer 102 is in a colorless state.

Figure 9:
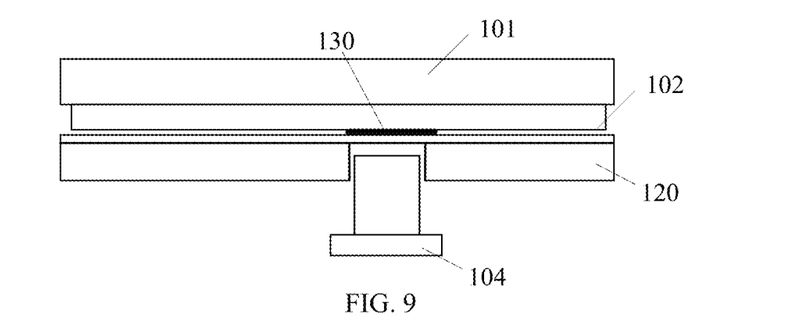
FIG. 9 is a schematic diagram of a color-changing layer of a terminal being located on a lower surface of a touch layer according to an example of the present disclosure.

FIG. 9 is a schematic diagram of a color-changing layer of a terminal located on a lower surface of a touch layer according to an example of the present disclosure. The color-changing layer 130 includes a color change material which is disposed on the lower surface of the touch layer 102 by sputtering, spraying, or coating.

In another implementation, the color-changing layer 130 includes a color change material and an electrode. The electrode is disposed in advance on the lower surface of the touch layer 102 during the preparation of the touch layer 102, and is electrically connected to the control module in the terminal through a conductive line. The control module controls the on/off state of the electrode. The color change material is disposed on the lower surface of the touch layer 102 by sputtering, spraying or coating. The color change material changes its own degree of light transmission according to the on/off state of the electrode. For example, when the electrode is in an on state, the color change material has a high degree of light transmission, and the touch layer 102 is in a colorless state. When the electrode is in an off state, the color change material has a low degree of light transmission, and the touch layer 102 is a colored state. Alternatively, when the electrode is in an on state, the color change material has a low degree of light transmission, and the touch layer 102 is in a colored state; and when the electrode is in an off state, the color change material has a high degree of light transmission, and the touch layer 102 is in a colorless state.

In another implementation, the color-changing layer 130 includes a color change material and an electric heating wire. The electric heating wire is disposed in advance on the lower surface of the touch layer 102 during the preparation of the touch layer 102, and is electrically connected to the control module in the terminal through a conductive line. The control module controls the on/off state of the electric heating wire. The color change material is disposed on the lower surface of the touch layer 102 by sputtering, spraying or coating. The color change material changes its own degree of light transmission according to the temperature of the electric heating wire. For example, when the temperature of the electric heating wire is high, the color change material has a high degree of light transmission, and the touch layer 102 is in a colorless state. When the temperature of the electric heating wire is low, the color change material has a low degree of light transmission, and the touch layer 102 is in a colored state. Alternatively, when the temperature of the electric heating wire is low, the color change material has a low degree of light transmission, and the touch layer 102 is in a colored state; and when the temperature of the electric heating wire is high, the color change material has a high degree of light transmission, and the touch layer 101 is in a colorless state.

It should be noted that the above-mentioned thermochromic layer adopts an electric heating wire only as an exemplary description, and other implementations may be adopted. For example, an alternating current signal is directly applied to the thermochromic material, and the thermochromic material itself is heated to a color change temperature.

The terminal can cause the color-changing layer 130 to switch between a colored state and a colorless state when needed. When the terminal satisfies a first condition, the color-changing layer 130 switches from the colorless state to the colored state. When the first condition is not satisfied, the color-changing layer 130 switches from the colored state to the colorless state.

For example, the first condition includes: when the sensor 104 is in a non-operating state and the display screen is in a non-display state, the color-changing layer 130 of the terminal switches from the colorless state to the colored state. Optionally, when the terminal needs to activate the sensor 104 to be in an operating state, or the display screen to be in a display state, the color-changing layer 130 switches from the colored state to the colorless state.

It should be noted that the first condition in the foregoing example is only an exemplary description, and there may be other conditions, which are not limited here.

In one example, to ensure that the display screen and the color-changing layer have a small chromatic aberration, the color-changing layer further includes at least one intermediate state between the colored state and the colorless state. The terminal can switch the color-changing layer 130 among the colored state, the intermediate state, and the colorless state as needed. In the illustrative example, when a second condition is satisfied, the color-changing layer 130 switches from the intermediate state to the colored state;

when a third condition is satisfied, the color-changing layer 130 switches from the colorless state to the colored state;

when a fourth condition is satisfied, the color-changing layer 130 switches from the intermediate state to the colorless state;

when a fifth condition is satisfied, the color-changing layer 130 switches from the colorless state to the intermediate state;

when a sixth condition is satisfied, the color-changing layer 130 switches from the colored state to the intermediate state; and when a seventh condition is satisfied, the color-changing layer 130 switches from the colored state to the colorless state.

Illustratively, when the display screen displays content and the brightness is low (such as in a night mode or a sunlight screen mode in a strong sunlight state), the control module controls the color-changing layer 130 to be in the intermediate state. Of course, the color-changing layer 130 being in the intermediate state is not limited to the above conditions. Taking the color-changing layer 130 including one intermediate state as an example, the second condition includes: when the color-changing layer 130 is currently in the intermediate state and the terminal controls the display screen to enter a screen-off state, the color-changing layer 130 switches from the intermediate state to the colored state;

the third condition includes: when the sensor 104 is in a non-operating state and the sensor area of the display screen 120 is in a non-display state, the color-changing layer 130 switches from the colorless state to the colored state;

the fourth condition includes: when the color-changing layer 130 is in an intermediate state and the terminal activates the sensor, the color-changing layer 130 switches from the intermediate state to the colorless state;

the fifth condition includes: when the sensor switches from being activated to being deactivated and the brightness of the display screen is low, the color-changing layer switches from the colorless state to the intermediate state;

the sixth condition includes: when the display screen switches from the screen-off state to a screen-on state and the brightness is low, the color-changing layer 130 switches from the colored state to the intermediate state; and the seventh condition includes: when the display screen switches from the screen-on state to the sensor 104 being activated, the color-changing layer 130 switches from the colored state to the colorless state.

It should be noted that the second to seventh conditions in the above examples are only for illustration, and other conditions may be used. The color-changing layer may also include a plurality of intermediate states. For example, when there are two intermediate states, the color-changing layer has a light transmittance between 25% and 50% (corresponding to one intermediate state), and between 50% and 75% (corresponding to the other intermediate state). When there is a plurality of intermediate states, the activation condition of each intermediate state may be different.

The color change material of the color-changing layer 130 is disposed on the upper surface or the lower surface of the touch layer 102 by sputtering, spraying or coating, and when being coated on the upper surface or the lower surface of the touch layer 102, the coating method is simple and easy for mass production.

Figure 10:
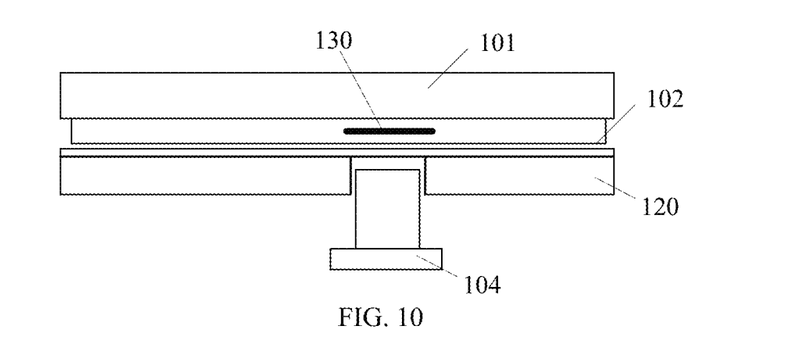
FIG. 10 is a schematic diagram of a color-changing layer of a terminal being located inside a touch layer according to an example of the present disclosure.

FIG. 10 is a schematic diagram of a color-changing layer of a terminal located inside a touch layer according to an example of the present disclosure. The color change material is disposed inside the touch layer. A material having a color change ability is disposed in the touch layer 102 during the process of manufacturing the touch layer.

In one implementation, the color-changing layer 130 includes a color change material and an electrode. The electrode is disposed in advance inside the touch layer 102 during the preparation of the touch layer 102, and is electrically connected to the control module in the terminal through a conductive line. The control module controls the on/off state of the electrode. The color change material is disposed inside the touch layer 102 by sputtering, spraying or coating. The color change material changes its own degree of light transmission according to the on/off state of the electrode. For example, when the electrode is in an on state, the color change material has a high degree of light transmission, and the touch layer 102 is in a colorless state. When the electrode is in an off state, the color change material has a low degree of light transmission, and the touch layer 102 is a colored state. Alternatively, when the electrode is in an on state, the color change material has a low degree of light transmission, and the touch layer 102 is in a colored state; and when the electrode is in an off state, the color change material has a high degree of light transmission, and the touch layer 102 is in a colorless state.

In another implementation, the color-changing layer 130 includes a color change material and an electric heating wire. The electric heating wire is disposed in advance inside the touch layer 102 during the preparation of the touch layer 102, and is electrically connected to the control module in the terminal through a conductive line. The control module controls the on/off state of the electric heating wire. The color change material is disposed inside the touch layer 102 by sputtering, spraying or coating. The color change material changes its own degree of light transmission according to the temperature of the electric heating wire. For example, when the temperature of the electric heating wire is high, the color change material has a high degree of light transmission, and the touch layer 102 is in a colorless state. When the temperature of the electric heating wire is low, the color change material has a low degree of light transmission, and the touch layer 102 is in a colored state. Alternatively, when the temperature of the electric heating wire is low, the color change material has a low degree of light transmission, and the touch layer 102 is in a colored state; and when the temperature of the electric heating wire is high, the color change material has a high degree of light transmission, and the touch layer 101 is in a colorless state.

Since the color-changing layer 130 is disposed inside the touch layer 102, the problem of falling off due to friction between the display screen 120 and the front cover 101 is overcome, and the display stability of the terminal is improved.

Optionally, the touch layer 102 is connected to an IC touch chip through a flexible circuit board. The electrical connection line of the color-changing layer 130 is disposed on the flexible circuit board. The IC touch chip is connected to the control unit in the terminal.

Optionally, when the terminal does not activate the sensor, the display screen 120 of the terminal includes two operating states: a screen-off state and a screen-on state. When the display screen 120 is in a screen-off state, the color-changing layer is in a colored state. When being in the colored state, the color-changing layer 130 is consistent with or close to the color of the surrounding area. When the display screen 120 is in a screen-on state, the position corresponding to the sensor includes two states: displaying content and not displaying content. When the content is not displayed, the control module controls the color-changing layer to be in a colored state, and the color is consistent with or close to the surrounding. When the content is displayed, the color-changing layer is in a colorless state and does not affect the display content of the screen underneath.

The above examples can be freely combined, and the specific combination manner is not limited.

Optionally, the shape of the sensor area may be any one of a circular shape, a teardrop shape, an elliptical shape, a rectangular shape, and an irregular shape. The shape of the color-changing layer 130 is consistent with or close to the size and shape of the sensor area. That is, the color-changing layer 130 covers only the sensor area. Alternatively, the color-changing layer 130 may cover a part of the terminal's screen where the sensor area is located. For example, when the sensor is located within the upper part of the terminal (forehead), the color-changing layer 130 covers one third of the upper part of the terminal's screen. When the sensor is located within the lower part of the terminal (chin), the color-changing layer 130 covers one third of the lower part of the terminal's screen. It should be noted that covering one third of the terminal's screen mentioned above is only an example, which can also be one quarter or one fifth, as long as the sensor area can be covered. Alternatively, the color-changing layer 130 covers the entire area of the terminal's screen.

Examples of the present disclosure also provide a terminal that includes a display component. The display component includes a display screen and a color-changing layer disposed above the display screen for switching between a colorless state and a colored state. The color-changing layer is configured to replace all or part of the polarizer in the conventional display screen. The color-changing layer is configured to adjust the light transmittance.

Optionally, the terminal controls the color-changing layer to switch between the colorless state and the colored state when needed. For example, the terminal controls the color-changing layer to switch between the colorless state and the colored state according to the brightness requirement of the display screen.

Optionally, at least one intermediate state is further provided between the colorless state and the colored state. The color-changing layer is configured to switch among the colorless state, the at least one intermediate state, and the colored state. The terminal controls the color-changing layer to switch among the colorless state, the at least one intermediate state, and the colored state as needed. For example, the terminal controls the color-changing layer to switch among the colorless state, the at least one intermediate state, and the colored state according to the brightness requirement of the display screen. Alternatively, the terminal controls the color-changing layer to switch among the colorless state, the at least one intermediate state, and the colored state according to the brightness requirement of the display screen and the operating state of the under-screen sensor.

Optionally, the sensor is a photosensitive sensor, which is a sensor that operates with light. The photosensitive sensor includes at least one of a camera, an ambient light sensor, a distance sensor, or a light sensitive fingerprint sensor.

Optionally, the terminal further includes a middle frame. The display screen is disposed on the front side of the middle frame. The display screen occupies the entire area or almost the entire area of the front side (e.g., 95% or more, 97% or more, 98% or more).

Optionally, the color-changing layer covers the entire area of the display screen (to replace the entire polarizer). Or, the color-changing layer covers the sensor area on the display screen (replaces part of the polarizer). A sensor is provided below the display screen. A photosensitive portion of the sensor is located within a first orthographic projection range of the sensor area. The sensor area is located within a second orthographic projection range of the color-changing layer.

The shape of the sensor area may be any one of a circular shape, a teardrop shape, an elliptical shape, a rectangular shape, and an irregular shape. The shape of the color-changing layer 130 is the same as or close to the size and shape of the sensor area. That is, the color-changing layer 130 covers only the sensor area. Alternatively, the color-changing layer 130 covers a part of the terminal's screen where the sensor area is located. For example, when the sensor is located within the upper part of the terminal (forehead), the color-changing layer 130 covers one third of the upper part of the terminal's screen. When the sensor is located within the lower part of the terminal (chin), the color-changing layer 130 covers one third of the lower part of the terminal's screen. It should be noted that covering one third of the terminal's screen mentioned above is only an example, which can also be one quarter or one fifth, as long as the sensor area can be covered. Alternatively, the color-changing layer 130 covers the entire area of the terminal's screen.

In the example, by providing a color-changing layer at a position corresponding to the sensor area, when the sensor needs to be used, the color-changing layer is controlled to be in a colorless state, thereby not affecting the normal use of the sensor; and when the sensor is not used, the color-changing layer is in a colored state, so that the color-changing layer and the surrounding color are consistent or the same, which can effectively reduce the color difference between the sensor area and the surrounding, and improve the aesthetic appearance of the terminal.

The degree of brightness of the screen is controlled by replacing all or part of the polarizer with the color-changing layer on the display component, which can effectively reduce the difficulty of the screen manufacturing process, thereby improving the yield of the screen component.

Optionally, the terminal further includes a middle frame. The display screen is disposed on the front side of the middle frame. The display screen occupies the entire area or almost the entire area of the front side (e.g., 95% or more, 97% or more, 98% or more).

The color-changing layer 130 can switch between a colorless state and a colored state. For example, the color-changing layer 130 is controlled to switch from the colored state to the colorless state when the sensor 104 is in an operating state; and the color-changing layer 130 is controlled to switch from the colorless state to the colored state when the sensor 104 is in a non-operating state. For example, when the display screen 120 is displaying content, the color-changing layer 130 switches to a colorless state, and when the display screen 120 does not display content, the color-changing layer 130 is in a colored state.

The colored state and the colorless state are sensory descriptions of the transparency of the color-changing layer, and are not intended to limit the type of the color and the presence or absence of the color in an absolute sense. Taking the color-changing layer being completely opaque is black as an example, the colored state may refer to a state in which the color is dark in the senses. For example, the light transmittance of the color-changing layer being 10% or 20% and the color being dark in the senses may refer to that the color-changing layer is in a colored state. For example, the light transmittance of the light transmittance being 80% or 90% and the color being light in the senses may refer to that the color-changing layer is in a colorless state.

The colored state may refer to a state in which the color is dark in the senses. For example, the color-changing layer being in a completely opaque state is black. Or, the colored state is a state in which the light transmittance is less than a first threshold. For example, the light transmittance of the color-changing layer is 0%, 10% or 20%.

The colorless state may refer to a state in which there is no color or the color is light in the senses. Or, the colorless state is a state in which the light transmittance is less than a second threshold. The colorless state is that the light transmittance is 80%, 90% or 100%. For ease of understanding and description, the colorless state may also be referred to as a light transmissive state, a transparent state, or the like.

The intermediate state may refer to a state in which the color is between the colorless state and the colored state in the senses. Or, the intermediate state is a state in which the light transmittance is greater than the first threshold and less than a second threshold. For example, the light transmittance of the color-changing layer in the intermediate state is between 40% and 60%.

The color-changing layer may also be other colors when being completely opaque, for example, red, gold, green, etc., and is uniform with the color of the terminal.

Optionally, a front cover is disposed above the display screen. The color-changing layer is disposed on an upper surface or a lower surface of the front cover, or the inside of the front cover.

Optionally, a front cover is disposed above the display terminal. A touch layer is disposed between the front cover and the display screen. The color-changing layer is disposed on an upper surface or a lower surface of the touch layer, or inside the touch layer.

Optionally, the color-changing layer includes any one of an electrochromic layer, a thermochromic layer, and a magnetochromic layer. When the color-changing layer is a magnetochromic layer, a coil structure corresponding to the magnetochromic layer is disposed below the display screen. The coil structure is configured to generate a magnetic field for controlling the magnetochromic layer.

Optionally, the terminal further includes a control module. The color-changing layer is electrically connected to the control module. The control module is configured to control the color-changing layer to switch from a colored state to a colorless state when the sensor is in an operating state.

Optionally, the control module is configured to control the color-changing layer to switch from the colorless state to the colored state when the sensor is in a non-operating state Optionally, the sensor area is a through hole formed on the display screen, which is at least one of a circular shape, a teardrop shape, an elliptical shape, a rectangular shape, and an irregular shape; or the sensor area is a semi-open groove structure formed on the display screen, such as bangs screen; or the sensor area is a transparent display area formed on the display screen, and the transparent display area is transparent in a non-display state.

Optionally, the sensor area is a transparent display area formed on the display screen. The transparent display area is transparent in the non-display state. The control module is configured to control the color-changing layer to switch from a colorless state to a colored state when the transparent display area is in a non-display state and the sensor is in a non-operating state.

The position and the color change manner of the color-changing layer are the same as those of the examples of FIG. 1 to FIG. 12 in the foregoing examples, and details are not described herein again.

Figure 11:
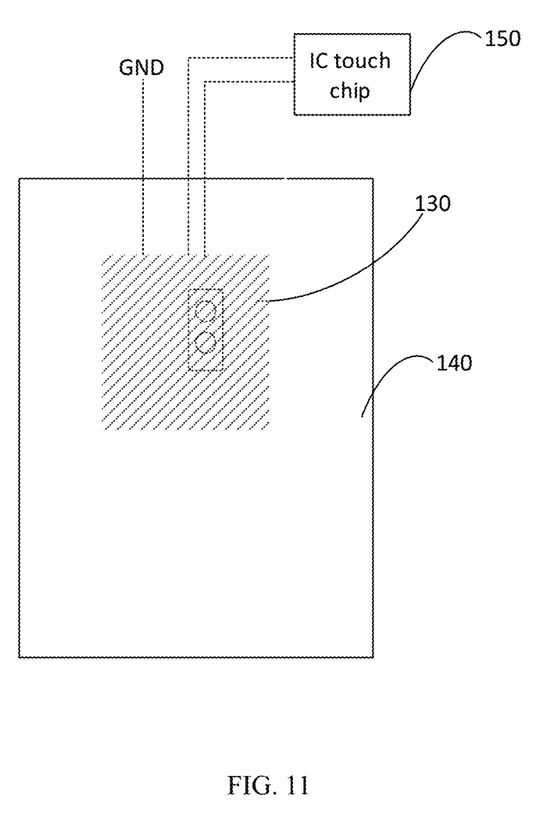
FIG. 11 is a schematic diagram of a back structure of a terminal according to an example of the present disclosure.

Examples of the present disclosure also provide a terminal. FIG. 11 is a schematic diagram showing the structure of the back side of the terminal according to an example of the present disclosure. The terminal includes a back cover 140 and a color-changing layer disposed above the back cover. The color-changing layer is configured to switch between a colorless state and a colored state.

Optionally, the color-changing layer covers the entire area of the back cover. Or, the color-changing layer covers a sensor area on the back cover. A sensor is disposed below the back cover. A photosensitive portion of the sensor is located within a first orthographic projection range of the sensor area. The sensor area is located within a second orthographic projection range of the color-changing layer.

The back cover 140 includes a sensor area. A sensor is disposed below the sensor area. The sensor includes a camera, a distance measuring sensor or a flash. A photosensitive portion corresponding to the sensor is located within a projection range of the sensor area. A color-changing layer 130 is disposed on the back cover for switching between a colorless state and a colored state. The color-changing layer 130 at least covers the sensor. In one example, the color-changing layer 130 covers all of the back cover 140.

The back cover of the terminal is provided with the color-changing layer 130 capable of switching between a colorless state and a colored state. When the sensor is required to be used, the color-changing layer 130 is in a colorless state, which does not affect the normal use of the sensor. When the sensor is not needed, the color-changing layer 130 is in a colored state, which does not affect the aesthetic appearance of the back.

The colored state may refer to a state in which the color is dark in the senses. For example, the color-changing layer being in a completely opaque state is black. Or, the colored state is a state in which the light transmittance is less than a first threshold. For example, the light transmittance of the color-changing layer is 0%, 10% or 20%.

The colorless state may refer to a state in which there is no color or the color is light in the senses. Or, the colorless state is a state in which the light transmittance is less than a second threshold. The colorless state is that the light transmittance is 80%, 90% or 100%. For ease of understanding and description, the colorless state may also be referred to as a light transmissive state, a transparent state, or the like.

Optionally, at least one intermediate state is further provided between the colorless state and the colored state. The color-changing layer is configured to switch between the colorless state, the at least one intermediate state, and the colored state. For example, when the sensor is in an operating state, the color-changing layer enters the colorless state; when the sensor is in a non-operating state and a night mode, the color-changing layer enters the colored state and appears as a pure black back shell effect; and when the sensor is in a non-operating state and not in the night mode, the color-changing layer enters the intermediate state and presents a translucent amber effect. The present example does not limit the entry conditions of the respective states, which may be refer to the above examples or freely combined by those skilled in the art.

The intermediate state may refer to a state in which the color is between the colorless state and the colored state in the senses. Or, the intermediate state is a state in which the light transmittance is greater than the first threshold and less than the second threshold. For example, the light transmittance of the color-changing layer in the intermediate state is between 40% and 60%.

The color-changing layer may also be other colors when being completely opaque, for example, red, gold, green, etc., and is uniform with the color of the terminal.

Optionally, the color-changing layer 130 is disposed on an upper surface or a lower surface of the back cover, or inside the back cover.

When the color-changing layer 130 is disposed on an upper surface or a lower surface of the back cover 140, the color change material of the color-changing layer 130 is disposed on the back cover 140 by sputtering, spraying or coating. When the color-changing layer 130 is disposed inside the back cover 140, a material having a color change ability is disposed inside the back cover 140 during the process of making the back cover 140.

Optionally, the color-changing layer 130 includes any one of a thermochromic layer, an electrochromic layer, and a magnetochromic layer. When the color-changing layer is a magnetochromatic layer, a coil structure corresponding to the magnetochromic layer is further disposed below the display screen for generating a magnetic field that controls the magnetochromic layer. The specific implementation may be made reference to the foregoing examples of FIG. 3 and FIG. 4.

The terminal is provided with a color-changing layer at the position of the back cover corresponding to the rear camera. The color-changing layer is controlled to be in a colored state by the control module during use, without affecting the function of the sensor. When the sensor is not in operation, the color-changing layer is in a colorless state. The color-changing layer covers the sensor to improve the overall aesthetics of the terminal.

By providing a color-changing layer at a position corresponding to the sensor area, when the sensor is required to be used, the color-changing layer is controlled to become a colorless state, thereby not affecting the normal use of the sensor; and when the sensor is not used, the color-changing layer is in a colored state, so that the color-changing layer and the color of the surrounding area are consistent or the same, which can effectively reduce the color difference between the sensor area and the surrounding area. Since the sensor area has a display capability, the display screen can have an integrated "mirror surface" effect in a display state or a non-display state, improving the aesthetic appearance of the terminal and the user experience.

According to examples of the present disclosure, there is provided a terminal, including a display screen including a sensor area, the sensor area being a transparent display area on the display screen a sensor disposed below the display screen, the sensor having a photosensitive portion; and a color-changing layer above the display screen, where the photosensitive portion of the sensor is within a first orthographic projection range of the sensor area, and the sensor area is within a second orthographic projection range of the color-changing layer; the transparent display area is transparent when the sensor is in operation; and the color-changing layer is configured to switch between a colorless state and a colored state.

In some examples, the display screen includes a polarizer layer, an encapsulation layer, an organic light emitting diode (OLED) layer, a drive circuit layer, a glass substrate layer and a light shielding layer arranged in sequence; an aligned opening area is formed on the polarizer layer, the glass substrate layer and the light shielding layer; and an area on the encapsulation layer, the OLED layer, and the drive circuit layer corresponding to the opening area forms the sensor area.

In some examples, the display screen includes a polarizer layer, a liquid crystal layer and a backlight layer arranged in sequence; an aligned opening area is formed on the polarizer layer and the backlight layer; and the sensor area is formed by an area on the liquid crystal layer corresponding to the opening area.

In some examples, a front cover is above the display screen, and the color-changing layer is on an upper surface or a lower surface of the front cover, or inside the front cover.

In some examples, a front cover and a touch layer between the front cover and the display screen are above the display screen, and the color-changing layer is on an upper surface or a lower surface of the touch layer, or inside the touch layer.

In some examples, the color-changing layer is configured to switch among the colorless state, at least one intermediate state and the colored state.

In some examples, the color-changing layer is a thermochromic layer or an electrochromic layer; a thermoelectric mixed color-changing layer.

In some examples, a control signal of the electrochromic layer is a direct current signal or an alternating current signal.

In some examples, the color-changing layer is a magnetochromic layer; and a coil structure corresponding to the magnetochromic layer is below the display screen, and the coil structure is configured to generate a magnetic field that controls the magnetochromic layer.

In some examples, the terminal further includes a controller, where the color-changing layer is electrically connected to the controller and the controller is configured to control the color-changing layer to switch from the colorless state to the colored state when a first condition is satisfied.

In some examples, the controller is configured to control the color-changing layer to switch from the colorless state to the colored state when the sensor is in a non-operating state and the display screen is in a non-display state.

In some examples, the terminal further includes a controller, where the control module is configured to control, when a second condition is met, the color-changing layer to switch from the intermediate state to the colored state:

In some examples, the controller is configured to control, when a third condition is met, the color-changing layer to switch from the colorless state to the colored state.

In some examples, the sensor includes at least one of a camera, an ambient light sensor, a distance sensor or a light sensor fingerprint sensor.

According to examples of the present disclosure, there is provided a terminal, including: a display component, the display component including a display screen and a color-changing layer disposed above the display screen, where the color-changing layer is configured to switch between a colorless state and a colored state.

In some examples, the color-changing layer covers an entire area of the display screen.

In some examples, the terminal further includes a sensor below the display screen, the sensor having a photosensitive portion; the color-changing layer covers a sensor area of the display screen, and the photosensitive portion of the sensor is located within a first orthographic projection range of the sensor area; and the sensor area is located within a second orthographic projection of the color-changing layer.

According to examples of the present disclosure, there is provided a terminal, including a back cover and a color-changing layer above the back cover, where the color-changing layer is configured to switch between a colorless state and a colored state.

In some examples, the color-changing layer covers an entire area of the back cover;

In some examples, the terminal further includes a sensor below the display screen, the sensor having a photosensitive portion; the color-changing layer covers a sensor area of the back cover, the photosensitive portion of the sensor is within a first orthographic projection range of the sensor area; and the sensor area is within a second orthographic projection of the color-changing layer.

It should be understood that "a plurality of" as referred to herein means two or more. "And/or" is used to describe the association relationship of the associated objects, indicating that there may be three relationships. For example, A and/or B may indicate that there are three cases where A exists separately, A and B exist at the same time, and B exists separately. The character "/" generally indicates that the contextual objects have an "or" relationship.

The serial numbers of the above-described examples of the present disclosure are merely for the description, and do not represent the advantages and disadvantages of the examples.

The foregoing descriptions are only examples of the present disclosure, and are not intended to limit the present disclosure. Within the spirit and principles of the disclosure, any modifications, equivalent substitutions, improvements, etc., are within the protection scope of the present disclosure.

The invention claimed is:

1. A terminal, comprising:
a display screen comprising a sensor area, the sensor area being a transparent display area on the display screen;

a sensor disposed below the display screen, the sensor having a photosensitive portion;
a color-changing layer above the display screen; and
a controller electrically connected to the color-changing layer,
wherein the photosensitive portion of the sensor is within a first orthographic projection range of the sensor area, and the sensor area is within a second orthographic projection range of the color-changing layer;
the transparent display area is transparent when the sensor is in operation;
the color-changing layer is configured to switch among a colorless state, at least one intermediate state, and a colored state, the colored state is a state in which light transmittance is less than a first threshold, the colorless state is a state in which the light transmittance is greater than a second threshold, and the intermediate state is a state in which the light transmittance is greater than the first threshold and less than the second threshold; and
the controller is configured to:
control, in response to satisfying a second condition, the color-changing layer to switch from the intermediate state to the colored state,
control, in response to satisfying a third condition, the color-changing layer to switch from the colorless state to the colored state,
control, in response to satisfying a fourth condition, the color-changing layer to switch from the intermediate state to the colorless state,
control, in response to satisfying a fifth condition, the color-changing layer to switch from the colorless state to the intermediate state,
control, in response to satisfying a sixth condition, the color-changing layer to switch from the colored state to the intermediate state, and
control, in response to satisfying a seventh condition, the color-changing layer to switch from the colored state to the colorless state;
wherein the second condition comprises the color-changing layer being currently in the intermediate state and the terminal controlling the display screen to enter a screen-off state, the third condition comprises the sensor being in a non-operating state and the sensor area of the display screen being in a non-display state, the fourth condition comprises the color-changing layer being in the intermediate state and the sensor is activated, the fifth condition comprises the sensor switching from being activated to being deactivated and brightness of the display screen being lower than a brightness threshold, the sixth condition comprises the display screen switching from the screen-off state to a screen-on state and the brightness being lower than the brightness threshold, and the seventh condition includes the display screen switching from the screen-on state to the sensor being activated.

2. The terminal according to claim 1, wherein the display screen further comprises a polarizer layer, an encapsulation layer, an organic light emitting diode (OLED) layer, a drive circuit layer, a glass substrate layer and a light shielding layer arranged in sequence;
an aligned opening area is on the polarizer layer, the glass substrate layer and the light shielding layer; and
the sensor area is on the encapsulation layer, the OLED layer, and the drive circuit layer corresponding to the opening area.

3. The terminal according to claim 1, wherein the display screen further comprises a polarizer layer, a liquid crystal layer and a backlight layer arranged in sequence;
an aligned opening area is on the polarizer layer and the backlight layer; and
the sensor area comprises an area on the liquid crystal layer corresponding to the opening area.

4. The terminal according to claim 1, wherein a front cover is above the display screen, and the color-changing layer is on an upper surface or a lower surface of the front cover, or inside the front cover.

5. The terminal according to claim 1, wherein a front cover and a touch layer between the front cover and the display screen are above the display screen, and the color-changing layer is on an upper surface or a lower surface of the touch layer, or inside the touch layer.

6. The terminal according to claim 1, wherein the color-changing layer is a thermochromic layer, an electrochromic layer or a thermoelectric mixed color-changing layer.

7. The terminal according to claim 6, wherein a control signal of the electrochromic layer is a direct current signal or an alternating current signal.

8. The terminal according to claim 1, wherein the color-changing layer is a magnetochromic layer; and
a coil structure corresponding to the magnetochromic layer is below the display screen, and the coil structure is configured to generate a magnetic field that controls the magnetochromic layer.

9. The terminal according to claim 1, wherein the sensor comprises at least one of a camera, an ambient light sensor, a distance sensor or a light sensor fingerprint sensor.

10. A terminal, comprising: a display component, the display component comprising a display screen, a color-changing layer disposed above the display screen and a controller electrically connected to the color-changing layer, wherein
the color-changing layer is configured to switch among a colorless state, at least one intermediate state, and a colored state, the colored state is a state in which light transmittance is less than a first threshold, the colorless state is a state in which the light transmittance is greater than a second threshold, and the intermediate state is a state in which the light transmittance is greater than the first threshold and less than the second threshold; and
the controller is configured to:
control, in response to satisfying a second condition, the color-changing layer to switch from the intermediate state to the colored state,
control, in response to satisfying a third condition, the color-changing layer to switch from the colorless state to the colored state,
control, in response to satisfying a fourth condition, the color-changing layer to switch from the intermediate state to the colorless state,
control, in response to satisfying a fifth condition, the color-changing layer to switch from the colorless state to the intermediate state,
control, in response to satisfying a sixth condition, the color-changing layer to switch from the colored state to the intermediate state, and
control, in response to satisfying a seventh condition, the color-changing layer to switch from the colored state to the colorless state;
wherein the second condition comprises the color-changing layer being currently in the intermediate state and the terminal controlling the display screen to enter a screen-off state, the third condition comprises the sensor being in a non-operating state and the sensor area of the display screen being in a non-display state, the fourth condition comprises the color-changing layer being in the intermediate state and the sensor is activated, the fifth condition comprises the sensor switching from being activated to being deactivated and brightness of the display screen being lower than a brightness threshold, the sixth condition comprises the display screen switching from the screen-off state to a screen-on state and the brightness being lower than the brightness threshold, and the seventh condition includes the display screen switching from the screen-on state to the sensor being activated.

11. The terminal according to claim 10, wherein the color-changing layer covers an entire area of the display screen.

12. The terminal according to claim 10, wherein the terminal further comprises a sensor below the display screen, the sensor having a photosensitive portion; the color-changing layer covers a sensor area of the display screen; the photosensitive portion of the sensor is within a first orthographic projection range of the sensor area; and the sensor area is within a second orthographic projection of the color-changing layer.

* * * * *